US 10,559,733 B2

(12) United States Patent
Song

(10) Patent No.: US 10,559,733 B2
(45) Date of Patent: Feb. 11, 2020

(54) LIGHT-EMITTING DEVICE PACKAGE

(71) Applicant: LG INNOTEK CO., LTD., Seoul (KR)

(72) Inventor: Yun Soo Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/065,431

(22) PCT Filed: Nov. 18, 2016

(86) PCT No.: PCT/KR2016/013317
§ 371 (c)(1),
(2) Date: Jun. 22, 2018

(87) PCT Pub. No.: WO2017/111320
PCT Pub. Date: Jun. 29, 2017

(65) Prior Publication Data
US 2018/0375005 A1 Dec. 27, 2018

(30) Foreign Application Priority Data
Dec. 23, 2015 (KR) .......................... 10-2015-0184714

(51) Int. Cl.
*H01L 33/62* (2010.01)
*H01L 33/64* (2010.01)
(Continued)

(52) U.S. Cl.
CPC .......... *H01L 33/62* (2013.01); *H01L 25/0753* (2013.01); *H01L 33/50* (2013.01); *H01L 33/641* (2013.01); *H01L 33/405* (2013.01)

(58) Field of Classification Search
CPC .......... H01L 33/48; H01L 33/50; H01L 33/62; H01L 33/64; H01L 33/405; H01L 33/641; H01L 25/0753; H01L 2224/49113
See application file for complete search history.

(56) References Cited

U.S. PATENT DOCUMENTS

2009/0311811 A1    12/2009  Oh et al.
2011/0220920 A1*   9/2011   Collins ............... H01L 33/504
                                                            257/88

(Continued)

FOREIGN PATENT DOCUMENTS

JP    2001-217464 A    8/2001
JP    2012-114303 A    6/2012
(Continued)

OTHER PUBLICATIONS

International Search Report for PCT/KR2016/013317 (PCT/ISA/210) dated Feb. 22, 2017.

*Primary Examiner* — Peniel M Gumedzoe
(74) *Attorney, Agent, or Firm* — Birch, Stewart, Kolasch & Birch, LLP

(57) ABSTRACT

A light-emitting device package according to an embodiment may include a body; N (herein, N denotes a positive integer of 5 or more) upper pads disposed on the body to be spaced apart from each other; N−1 light-emitting device chips respectively arranged on N−1 upper pads among the N upper pads; and a plurality of first wires for electrically connecting the N−1 light-emitting device chips and the N upper pads to each other by at least one of a plurality of wiring structures.

20 Claims, 9 Drawing Sheets

(51) Int. Cl.
*H01L 33/40* (2010.01)
*H01L 25/075* (2006.01)
*H01L 33/50* (2010.01)

(56) References Cited

U.S. PATENT DOCUMENTS

| | | | | |
|---|---|---|---|---|
| 2011/0248289 | A1* | 10/2011 | Hsieh | H01L 25/0753 257/88 |
| 2012/0086024 | A1* | 4/2012 | Andrews | H01L 25/0753 257/88 |
| 2012/0236568 | A1 | 9/2012 | Lee et al. | |
| 2013/0301257 | A1* | 11/2013 | Britt | H01L 25/0753 362/231 |

FOREIGN PATENT DOCUMENTS

| | | |
|---|---|---|
| JP | 2012-195587 A | 10/2012 |
| KR | 10-1237389 B1 | 2/2013 |
| KR | 10-2014-0072509 A | 6/2014 |
| KR | 10-2014-0086074 A | 7/2014 |

* cited by examiner

【FIG. 1】
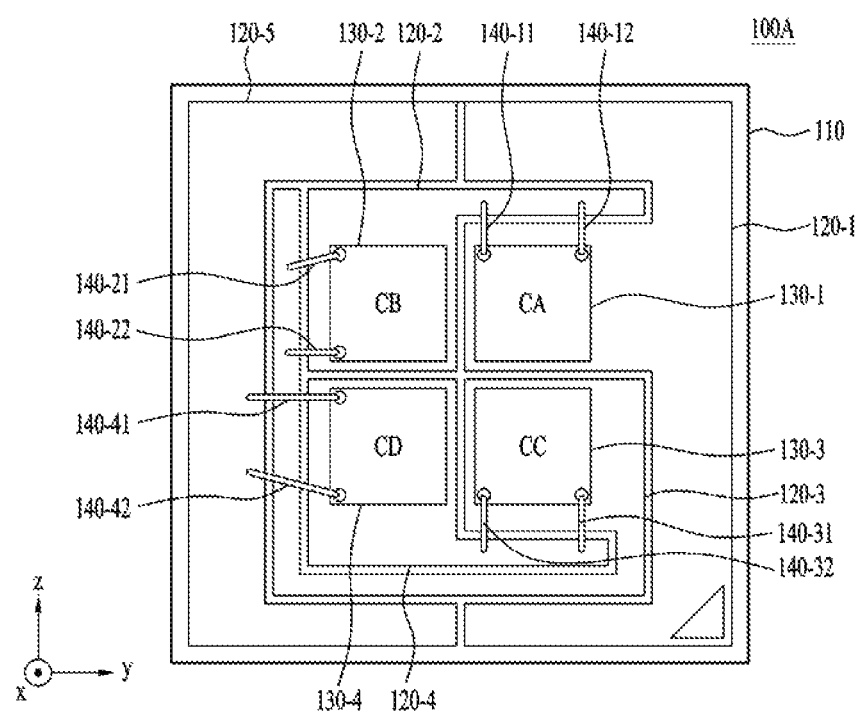

【FIG. 2】
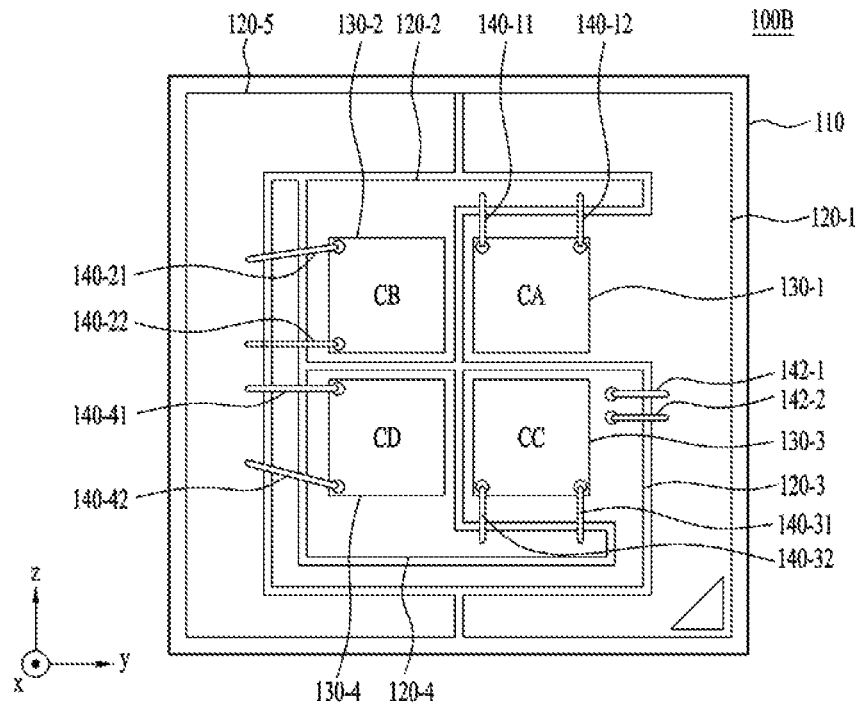
【FIG. 3】
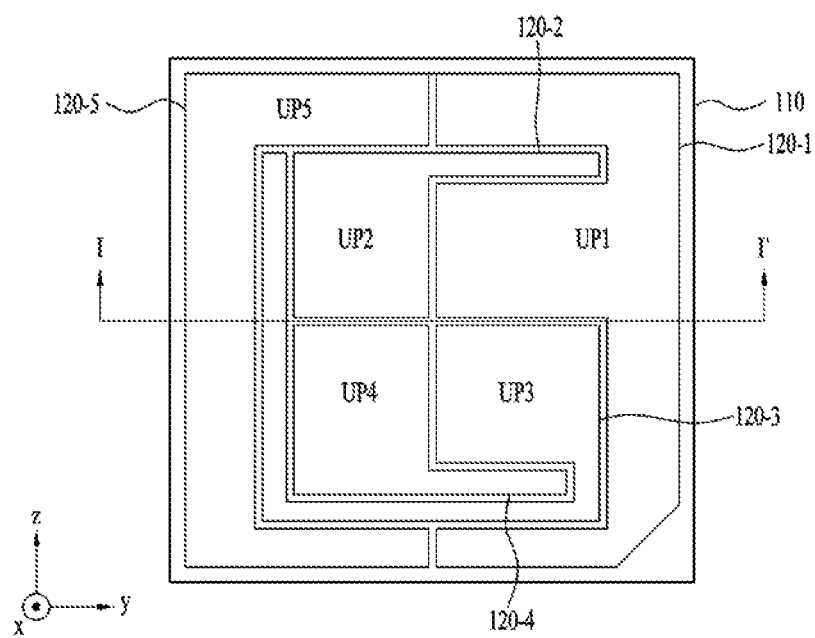

[FIG. 4]
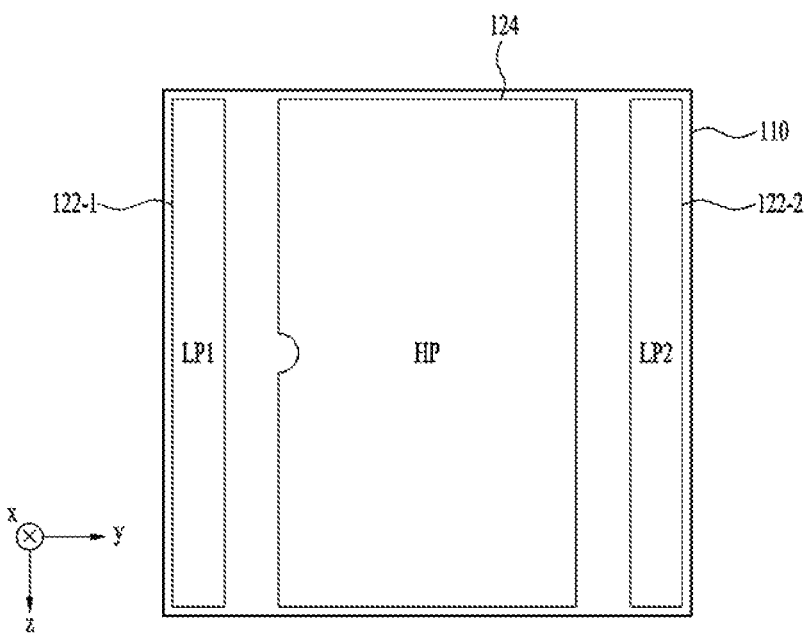
[FIG. 5]
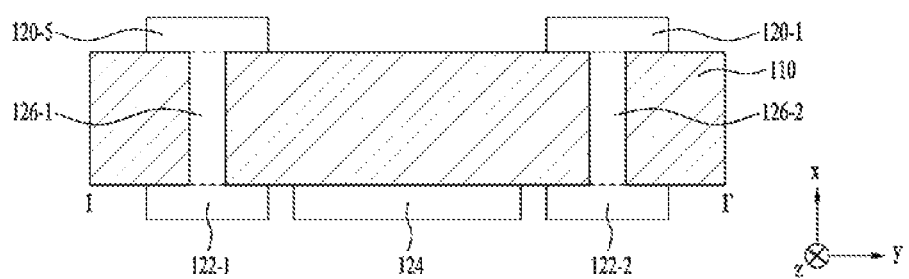

[FIG. 6]
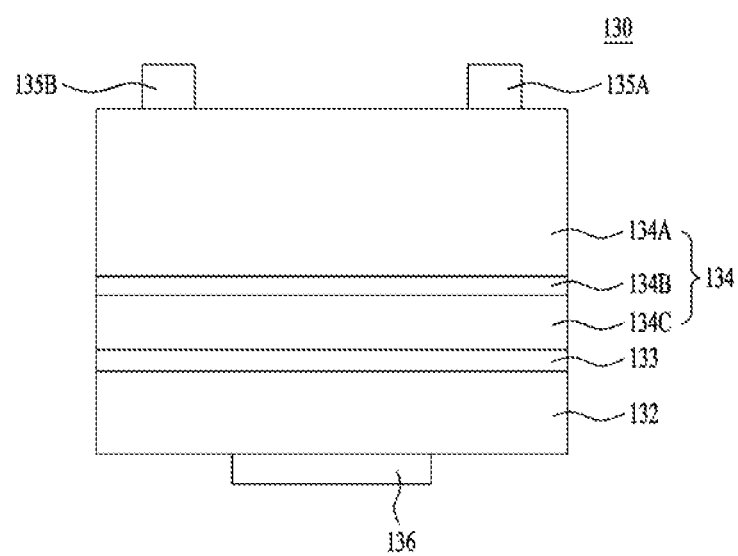
[FIG. 7]
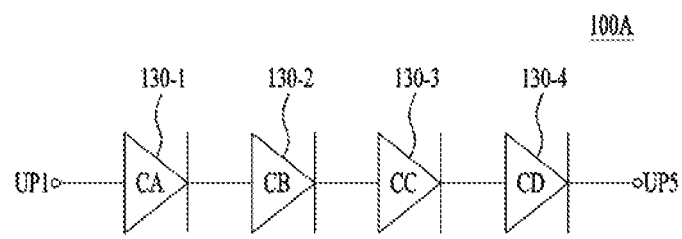

【FIG. 8】
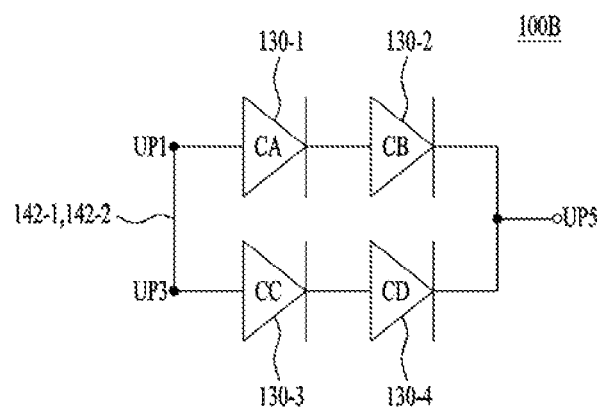
【FIG. 9】
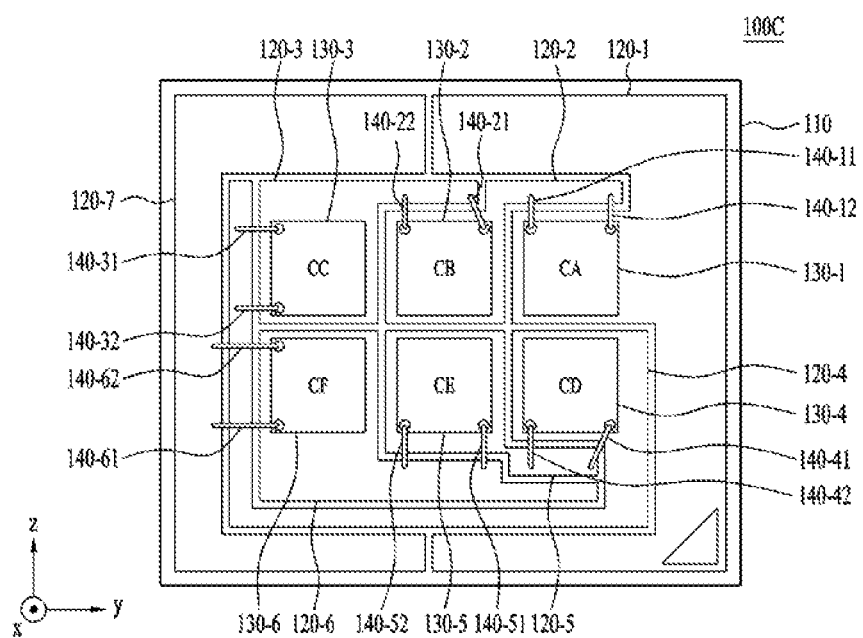

【FIG. 10】
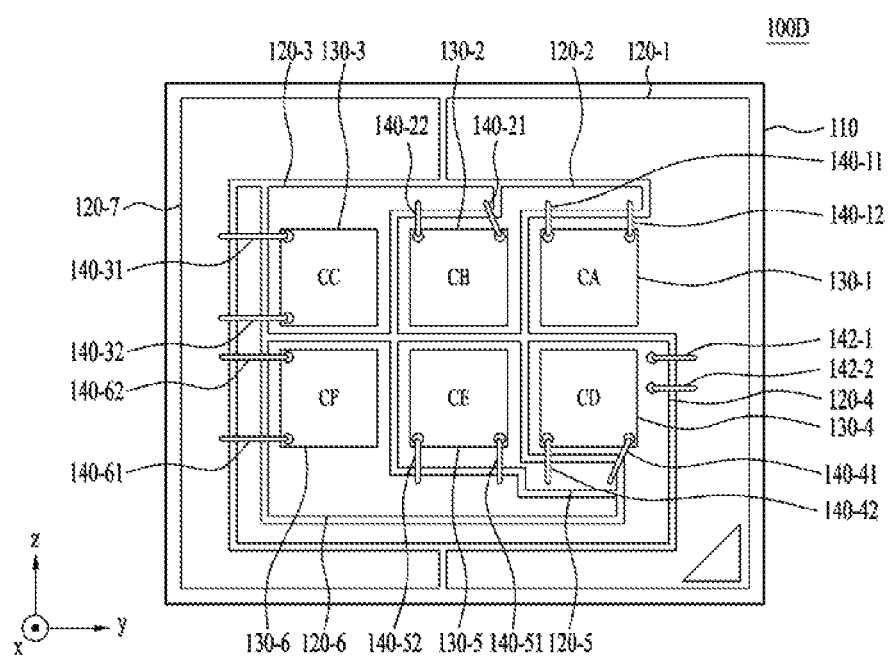

[FIG. 11]
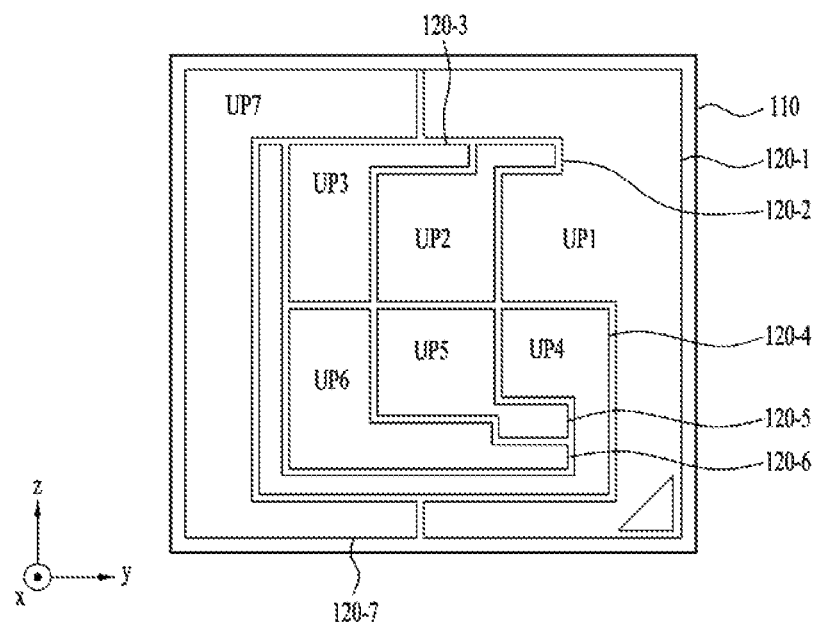
[FIG. 12]
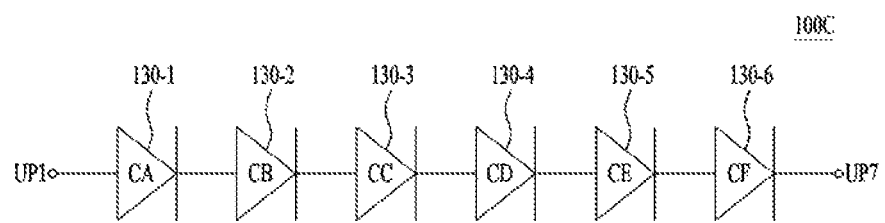

【FIG. 13】
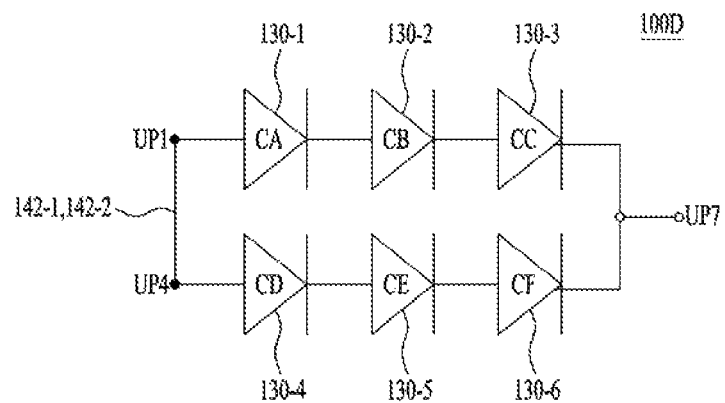
【FIG. 14a】
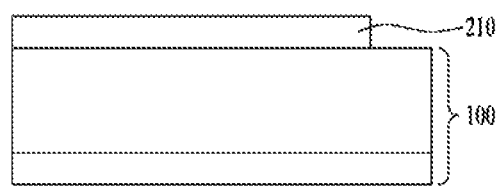
【FIG. 14b】
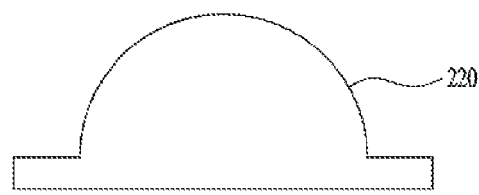

[FIG. 14c]
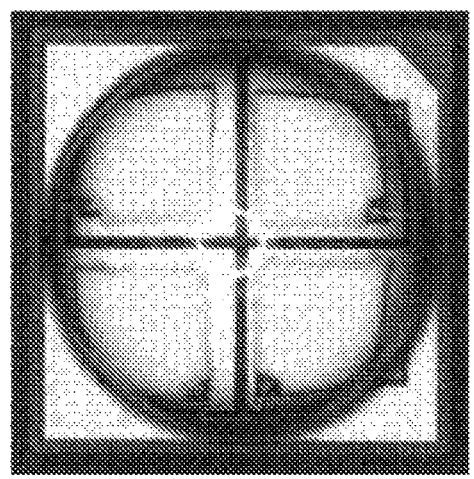

LIGHT-EMITTING DEVICE PACKAGE

CROSS REFERENCE TO RELATED APPLICATIONS

This application is the National Phase of PCT International Application No. PCT/KR2016/013317, filed on Nov. 18, 2016, which claims priority under 35 U.S.C. 119(a) to Patent Application No. 10-2015-0184714, filed in the Republic of Korea on Dec. 23, 2015, all of which are hereby expressly incorporated by reference into the present application.

TECHNICAL FIELD

Embodiments relate to a light-emitting device package.

BACKGROUND ART

Light-emitting diodes (LEDs) are one type of semiconductor element that converts electricity into infrared rays or light using the characteristics of a compound semiconductor, in order to transmit or receive signals or to be used as a light source.

Group III-V nitride semiconductors are in the spotlight as a core material for light-emitting devices such as light-emitting diodes (LEDs) or laser diodes (LDs) thanks to the physical and chemical properties thereof.

Such light-emitting diodes have excellent environmental friendliness because they include no environmentally harmful materials such as mercury (Hg), which has conventionally been used in lighting apparatuses such as incandescent lamps and fluorescent lamps, and also have other advantages, for example, a long lifespan and low power consumption. Therefore, existing light sources are being replaced with light-emitting diodes.

In the case of a conventional light-emitting device package including the above-described light-emitting device in the form of a chip, whenever attempting to change the circuit wiring structure of a plurality of light-emitting device chips, it may be troublesome to change the design of upper pads disposed above the light-emitting device chips.

TECHNICAL OBJECT

Embodiments provide a light-emitting device package capable of diversifying the circuit wiring of a plurality of light-emitting device chips in the state in which the shape of upper pads is fixed.

TECHNICAL SOLUTION

One embodiment may provide a light-emitting device package including a body, N (N denoting a positive integer of S or more) upper pads disposed on the body so as to be spaced apart from each other, N−1 light-emitting device chips respectively disposed on N−1 upper pads, among the N upper pads, and a plurality of first wires configured to electrically connect the N−1 light-emitting device chips and the N upper pads to each other by at least one structure among a plurality of wiring structures.

For example, the plurality of wiring structures may include serial connection structures, or may include serial and parallel connection structures.

For example, the light-emitting device package may further include a second wire configured to electrically connect some of the N upper pads to each other.

For example, the plurality of first wires may include an eleventh wire configured to connect first to $(N-1)/2^{th}$ light-emitting device chips, among the N−1 light-emitting device chips, to each other in series, and a twelfth wire configured to connect $((N-1)/2)+1^{th}$ to $N-1^{th}$ light-emitting device chips, among the N−1 light-emitting device chips, to each other in series, and the second wire may electrically connect the upper pad, on which the first light-emitting device chip is disposed, and the upper pad, on which the $((N-1)2)+1^{th}$ light-emitting device chip is disposed, to each other, among the N upper pads.

For example, a first upper pad and an $N^{th}$ upper pad, among the N upper pads, may be disposed at an outermost peripheral region of a plane of the light-emitting device package, and the remaining second to $N-1^{th}$ upper pads, excluding the first and $N^{th}$ upper pads, among the N upper pads may be surrounded by the first and $N^{th}$ upper pads when viewing in a planar shape.

For example, each of the first and $N^{th}$ upper pads may have a planar area greater than a planar area of each of the second to $N-1^{th}$ upper pads.

For example, the light-emitting device package may further include a first lower pad disposed on an underside of the body and electrically connected to one of the first and $N^{th}$ upper pads among the N upper pads, and a second lower pad spaced apart from the first lower pad on the underside of the body and electrically connected to a remaining one of the first and $N^{th}$ upper pads.

For example, the light-emitting device package may further include a first connection pad penetrating the body to interconnect one of the first and $N^{th}$ upper pads and the first lower pad, and a second connection pad penetrating the body to interconnect a remaining one of the first and $N^{th}$ upper pads and the second lower pad.

For example, the light-emitting device package may further include a heat dissipation pad disposed on the underside of the body between the first and second lower pads and spaced apart from each of the first and second lower pads. For example, the heat dissipation pad may be located at the center on the underside of the body. In addition, the area of a lower surface of the body that is occupied by the heat dissipation pad may be greater than the area of the lower surface of the body that is occupied by each of the first and second lower pads.

Another embodiment may provide a light-emitting device package including a body, a plurality of upper pads disposed on the body so as to be spaced apart from each other, a plurality of light-emitting device chips respectively disposed on some upper pads among the plurality of upper pads, and a plurality of first wires configured to electrically connect the light-emitting device chips and the upper pads to each other by at least one structure among a plurality of wiring structures, and the number of upper pads may be greater than the number of light-emitting device chips.

For example, the plurality of wiring structures may include serial connection structures, may include parallel connection structure, or may complexly include serial and parallel connection structures.

For example, the serial connection structure may include a first upper pad row including a plurality of pads connected to each other in series and a second upper pad row including a plurality of pads connected to each other in series, and the light-emitting device package may further include a second wire configured to electrically connect the first upper pad row and the second upper pad row to each other so as to realize the parallel connection structure.

For example, a first upper pad and a second upper pad, among the plurality of upper pads, may be disposed at an outermost peripheral region of a plane of the light-emitting device package, and the remaining upper pads, excluding the first and second upper pads, among the plurality of upper pads may be surrounded by the first and second upper pads when viewing in a planar shape.

For example, the plurality of light-emitting device chips may be surrounded by the first and second upper pads when viewing in a planar shape.

For example, the plurality of upper pads may be asymmetrically disposed in a plane.

Advantageous Effects

In a light-emitting device package according to embodiments, in the state in which the number and shape of upper pads and the number and shape of light-emitting device chips are fixed, the light-emitting device chips and the upper pads may be bonded and connected to each other in various ways using at least one of a first wire or a second wire. Thereby, it is possible to change the wiring structure of the light-emitting device chips in multiple ways, and to maximize the area occupied by the light-emitting device chip disposed on the upper pad, which may increase heat dissipation.

DESCRIPTION OF DRAWINGS

FIG. 1 illustrates a plan view of a light-emitting device package according to one embodiment.

FIG. 2 illustrates a plan view of a light-emitting device package according to another embodiment.

FIG. 3 illustrates a plan view of a body and first to fifth upper pads in the light-emitting device packages illustrated in FIGS. 1 and 2.

FIG. 4 illustrates a bottom view of the light-emitting device packages illustrated in FIGS. 1 and 2.

FIG. 5 illustrates a cross-sectional view taken along line I-I' of the light-emitting device package illustrated in FIG. 3.

FIG. 6 illustrates an exemplary cross-sectional view of each of first to fourth light-emitting device chips illustrated in FIGS. 1 and 2.

FIG. 7 illustrates the circuit wiring structure of the light-emitting device package illustrated in FIG. 1.

FIG. 8 illustrates the circuit wiring structure of the light-emitting device package illustrated in FIG. 2.

FIG. 9 illustrates a plan view of a light-emitting device package according to still another embodiment.

FIG. 10 illustrates a plan view of a light-emitting device package according to still another embodiment.

FIG. 11 illustrates a plan view of a body and first to seventh upper pads in the light-emitting device packages illustrated in FIGS. 9 and 10.

FIG. 12 illustrates a circuit wiring diagram of the light-emitting device package illustrated in FIG. 9.

FIG. 13 illustrates a circuit wiring diagram of the light-emitting device package illustrated in FIG. 10.

FIGS. 14a to 14c are views for explaining a light-emitting device package according to still another embodiment.

BEST MODE

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

Hereinafter, light-emitting device packages 100A to 100D according to embodiments will be described using the Cartesian coordinate system, but the embodiments are not limited thereto, and needless to say, the light-emitting device packages may be described using any other coordinate system. With the Cartesian coordinate system, the x-axis, the y-axis and the z-axis may be orthogonal to one another, but the embodiments are not limited thereto. That is, the x-axis, the y-axis and the z-axis may cross one another.

FIG. 1 illustrates a plan view of a light-emitting device package 100A according to one embodiment, and FIG. 2 illustrates a plan view of a light-emitting device package 100B according to another embodiment.

The light-emitting device packages 100A and 100B illustrated in FIGS. 1 and 2 may include a body 110, N upper pads, N−1 light-emitting device chips, and a plurality of first wires. Here, N is a positive integer of 5 or more, and the number of first wires may be N−1 or 2(N−1).

Hereinafter, the light-emitting device packages 100A and 100B in the case where N=5 will be described with reference to FIGS. 1 to 8. For convenience, the N−1 light-emitting device chips are referred to as first to N−$1^{th}$ light-emitting device chips, and the N upper pads are referred to as first to $N^{th}$ upper pads.

In the case where N=5, the light-emitting device package 100A illustrated in FIG. 1 may include the body 110, first to fifth upper pads 120-1 to 120-5, first to fourth light-emitting device chips 130-1 to 130-4, and a plurality of first wires 140-11, 140-12, 140-21, 140-22, 140-31, 140-32, 140-41 and 140-42.

In addition, in the case where N=5, the light-emitting device package 100B illustrated in FIG. 2 may include the body 110, the first to fifth upper pads 120-1 to 120-5, the first to fourth light-emitting device chips 130-1 to 130-4, and the plurality of first wires 140-11, 140-12, 140-21, 140-22, 140-31, 140-32, 140-41 and 140-42, and may further include second wires 142-1 and 142-2.

The body 110 may be formed of ceramic, but the embodiment is not limited as to the material of the body 110. For example, the body 110 may include at least one of AlN or $Al_2O_3$.

FIG. 3 illustrates a plan view of the body 110 and the first to fifth upper pads 120-1 to 120-5 in the light-emitting device packages 100A and 100B illustrated in FIGS. 1 and 2.

For convenience, as illustrated in FIG. 3, the first to fifth upper pads 120-1 to 120-5 are denoted respectively by UP1, UP2, UP3, UP4 and UP5.

Referring to FIGS. 1 to 3, the first to fifth upper pads 120-1 to 120-5 (UP1 to UP5) are disposed on the body 110. The first to fifth upper pads 120-1 to 120-5 (UP1 to UP5) may be spaced apart from each other.

In addition, the first to fifth upper pads 120-1 to 120-5 (UP1 to UP5) may be asymmetrically disposed on the plane, but the embodiment is not limited thereto.

The first upper pad 120-1 (UP1) and the fifth upper pad 120-5 (UP5) (hereinafter, the fifth upper pad 120-5 (UP5) corresponds to the $N^{th}$ upper pad) may be disposed at the outermost region, i.e. the edge of the plane of the light-emitting device packages 100A and 100B.

In the planar shape of the light-emitting device packages 100A and 100B, the second upper pad 120-2 (UP2) to the fourth upper pad 120-4 (UP4) (hereinafter, the fourth upper pad 120-4 (UP4) corresponds to the $N-1^{th}$ upper pad) may be disposed so as to be surrounded by the first and fifth upper pads 120-1 and 120-5 (UP1 and UP5). That is, the second to fourth upper pads 120-2 to 120-4 (UP2 to UP4) may be disposed inside the edge of the plane of the light-emitting device packages 100A and 100B.

In addition, each of the first and fifth upper pads 120-1 and 120-5 (UP1 and UP5) may have a planar area greater than that of each of the second to fourth upper pads 120-2 to 120-4 (UP2 to UP4), but the embodiment is not limited thereto.

FIG. 4 illustrates a bottom view of the light-emitting device packages 100A and 100B illustrated in FIGS. 1 and 2.

Referring to FIG. 4, the light-emitting device packages 100A and 100B may further include first and second lower pads 122-1 and 122-2. For convenience, the first and second lower pads 122-1 and 122-2 are denoted respectively by LP1 and LP2.

Each of the first lower pad 122-1 (LP1) and the second lower pad 122-2 (LP2) may be disposed on the underside of the body 110, and may be spaced apart from each other.

The first lower pad 122-1 (LP1) may be electrically connected to one of the first upper pad 120-1 (UP1) and the fifth upper pad 120-5 (UP5), and the second lower pad 122-2 (LP2) may be electrically connected to the other one of the first upper pad 120-1 (UP1) and the fifth upper pad 120-5 (UP5).

FIG. 5 illustrates a cross-sectional view taken along line I-I' of the light-emitting device package illustrated in FIG. 3.

Referring to FIG. 5, the first upper pad 120-1 (UP1) is electrically connected to the second lower pad 122-2 (LP2) and the fifth upper pad 120-5 (UP5) is electrically connected to the first lower pad 122-1 (LP1), but the embodiment is not limited thereto. That is, according to another embodiment, unlike the illustration of FIG. 5, the first upper pad 120-1 (UP1) may be electrically connected to the first lower pad 122-1 (LP1) and the fifth upper pad 120-5 (UP5) may be electrically connected to the second lower pad 122-2 (LP2).

In addition, the light-emitting device packages 100A and 100B may further include first and second connection pads 126-1 and 126-2.

The first connection pad 126-1 may be disposed so as to penetrate the body 110, and may connect the first lower pad 122-1 to one of the first upper pad 120-1 (UP1) and the fifth upper pad 120-5 (UP5). In addition, the second connection pad 126-2 may be disposed so as to penetrate the body 110, and may connect the second lower pad 122-2 to the other one of the first upper pad 120-1 (UP1) and the fifth upper pad 120-5 (UP5).

For example, as illustrated in FIG. 5, the first connection pad 126-1 may connect the first lower pad 122-1 to the fifth upper pad 120-5 (UP5), and the second connection pad 126-2 may connect the second lower pad 122-2 to the first upper pad 120-1 (UP1), but the embodiment is not limited thereto.

The light-emitting device packages 100A and 100B according to the embodiments may further include a heat dissipation pad 124 (HP). Referring to FIG. 5, the heat dissipation pad 124 (HP) may be disposed on the underside of the body 110 between the first lower pad 122-1 (LP1) and the second lower pad 122-2 (LP2). The heat dissipation pad 124 (HP) may be spaced apart from each of the first lower pad 122-1 (LP1) and the second lower pad 122-2 (LP2). The heat dissipation pad 124 (HP) may function to dissipate heat that is generated in the first to fourth light-emitting device chips 130-1 to 130-4 and is transferred through the body 110, which may be formed of ceramic. In some cases, the heat dissipation pad 124 (HP) may be omitted.

In addition, the heat dissipation pad 124 (HP) may be located at the center on the underside of the body 110. In this case, when the plurality of light-emitting device chips 130-1 to 130-4 (CA to CD) are surrounded by the first and fifth upper pads 120-1 and 120-5 when viewing in a planar shape, the heat generated in the light-emitting device chips 130-1 to 130-4 (CA to CD) may be more rapidly dissipated through the heat dissipation pad 124 (HP) located at the center of the underside of the body 110.

The area of the lower surface of the body 110 that is occupied by the heat dissipation pad 124 (HP) may be greater than the area of the lower surface of the body 110 that is occupied by each of the first and second lower pads 122-1 and 122-2 (LP1 and LP2). This serves to allow the heat to be more rapidly dissipated through the heat dissipation pad 124 (HP).

The first to $N^{th}$ upper pads 120-1 to 120-5 (UP1 to UP5), the first and second lower pads 122-1 and 122-2 (LP1 and LP2), the first and second connection pads 126-1 and 126-2, and the heat dissipation pad 124 (HP) described above may be formed of an electrically conductive material, respectively, but the embodiment is not limited thereto. For example, each of these pads may include at least one of aluminum (Al), titanium (Ti), chrome (Cr), nickel (Ni), copper (Cu), or gold (Au) and may be formed in a single layer or in multiple layers, but the embodiment is not limited thereto.

Referring again to FIGS. 1 and 2, each of the first light-emitting device chip 130-1 to the fourth light-emitting device chip 130-4 (hereinafter, the fourth light-emitting device chip is the $N-1^{th}$ light-emitting device chip) may be disposed on a corresponding one of the first upper pad 120-1 (UP1) to the fourth upper pad 120-4 (UP4). For convenience, the first to fourth light-emitting device chips 130-1 to 130-4 are denoted respectively by CA to CD.

For example, the first light-emitting device chip 130-1 (CA) may be disposed on the first upper pad 120-1 (UP1), the second light-emitting device chip 130-2 (CB) may be disposed on the second upper pad 120-2 (UP2), the third light-emitting device chip 130-3 (CC) may be disposed on the third upper pad 120-3 (UP3), and the fourth light-emitting device chip 130-4 (CD) may be disposed on the fourth upper pad 120-4 (UP4).

Each of the first to fourth light-emitting device chips 130-1 to 130-4 (CA to CD) may have a vertical bonding structure, or may have a horizontal bonding structure, and the embodiment is not limited as to the bonding type and specific structure of the first to fourth light-emitting device chips 130-1 to 130-4 (CA to CD).

FIG. 6 illustrates a cross-sectional view of each 130 of the first to fourth light-emitting device chips 130-1 to 130-4 (CA to CD) illustrated in FIGS. 1 and 2.

Each 130 of the first to fourth light-emitting device chips 130-1 to 130-4 (CA to CD) illustrated respectively in FIGS. 1 and 2 may have a vertical bonding structure, as illustrated in FIG. 6.

Referring to FIG. 6, the light-emitting device chip 130 may include a conductive support substrate 132, a reflective layer 133, a light-emitting structure 134, first electrodes 135A and 135B, and a second electrode 136.

The support substrate 132 may include a conductive material. When the support substrate 132 is a conductive type, the entire support substrate 132 may replace the role of the second electrode 136 in cooperation with the reflective layer 133. In this case, the second electrode 136 may be omitted. The support substrate 132 may be formed of a metal having excellent electrical conductivity and may also be formed of a metal having high thermal conductivity because it needs to sufficiently dissipate heat generated during the operation of the light-emitting device 130.

For example, the support substrate 132 may be formed of a material selected from the group consisting of molybdenum (Mo), silicon (Si), tungsten (W), copper (Cu), and aluminum (Al), or an alloy thereof, and may further selectively include gold (Au), a copper (Cu) alloy, nickel (Ni), copper-tungsten (Cu—W), a carrier wafer (e.g., GaN, Si, Ge, GaAs, ZnO, SiGe, SiC, $Ga_2O_3$ or the like).

The reflective layer 133 serves to upwardly reflect the light that is discharged from an active layer 134B and directed to the support substrate 132. The reflective layer 133 may be disposed above the support substrate 132, and may have a thickness of about 2500 Å. For example, the reflective layer 133 may be configured with a metal layer including aluminum (Al), silver (Ag), nickel (Ni), platinum (Pt), rhodium (Rh), or an alloy including Al, Ag, Pt, or Rh. The reflective layer 133, which is formed of, for example, aluminum or silver, may effectively reflect the light generated from the active layer 134B, thereby greatly increasing the light extraction efficiency of the light-emitting device packages 100A and 100B.

The light-emitting structure 134 may be disposed above the reflective layer 133, and may include a first conductive semiconductor layer 134A, the active layer 134B, and a second conductive semiconductor layer 134C. The first conductive semiconductor layer 134A may be formed of a group III-V or II-VI compound semiconductor, which is doped with a first conductive dopant. When the first conductive type is an n-type, the first conductive semiconductor layer may include an n-type dopant, such as Si, Ge, Sn, Se, or Te, without being limited thereto.

For example, the first conductive semiconductor layer 134A may include a semiconductor material having a composition of $Al_xIn_yGa_{(1-x-y)}N$ ($0 \le x \le 1$, $0 \le y \le 1$, $0 \le x+y \le 1$). The first conductive semiconductor layer 134A may be formed of one or more of GaN, InN, AlN, InGaN, AlGaN, InAlGaN, AlInN, AlGaAs, InGaAs, AlInGaAs, GaP, AlGaP, InGaP, AlInGaP, and InP.

The active layer 134B is a layer in which electrons (or holes) introduced through the first conductive semiconductor layer 134A and holes (or electrons) introduced through the second conductive semiconductor layer 134C meet each other to discharge light having energy that is determined by the inherent energy band of a constituent material of the active layer 134B.

The active layer 134B may have at least one of a single-well structure, a multi-well structure, a single-quantum well structure, a multi-quantum well (MQW) structure, a quantum wire structure, or a quantum dot structure.

The active layer 134B may include a well layer and a barrier layer having a pair structure of one or more selected from among InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having a band gap smaller than the band gap of the barrier layer.

A conductive clad layer (not illustrated) may further be formed above and/or below the active layer 134B. The conductive clad layer may be formed of a semiconductor having a band gap wider than the band gap of the barrier layer of the active layer 134B. For example, the conductive clad layer may include GaN, AlGaN, InAlGaN, a superlattice structure, or the like. In addition, the conductive clad layer may be doped to be an n-type or a p-type.

The second conductive semiconductor layer 134C may be formed of a semiconductor compound. The second conductive semiconductor layer may be formed of, for example, a group III-V or II-VI compound semiconductor. For example, the second conductive semiconductor layer 134C may include a semiconductor material having a composition of $In_xAl_yGa_{1-x-y}N$ ($0 \le x \le 1$, $0 \le y \le 1$, $0 \le x+y \le 1$). When the second conductive type is a p-type, the second conductive semiconductor layer 134C may include a p-type dopant, such as Mg, Zn, Ca, Sr, or Ba.

The first electrodes 135A and 135B may be disposed on the first conductive semiconductor layer 134A. Here, two first electrodes 135A and 135B are illustrated, but the embodiment is not limited thereto. That is, according to another embodiment, the first electrodes 135A and 135B may be integrated, or may be divided into three or more. As illustrated, when the first electrodes 135A and 135B are provided in a plural number, current spreading efficiency may be increased. When current spreading efficiency is increased, current crowding may be improved and the operation voltage may be lowered. Moreover, when current spreading efficiency is increased, current injection efficiency with respect to an effective emission area may be increased, which may increase the efficiency of the light-emitting device.

The second electrode 136 may be disposed below the support substrate 132.

Each of the first electrodes 135A and 135B and the second electrode 136 described above may include at least one of aluminum (Al), titanium (Ti), chrome (Cr), nickel (Ni), copper (Cu), or gold (Au) and may be formed in a single layer or in multiple layers, but the embodiment is not limited as to the material of each of the first electrodes 135A and 135B and the second electrode 136.

Hereinafter, for convenience of description, the first to fourth light-emitting device chips 130-1 to 130-4 (CA to CD) will be described as having a vertical bonding structure, and the following description may also be applied to the case in which the first to fourth light-emitting device chips 130-1 to 130-4 (CA to CD) have a horizontal bonding structure.

Referring again to FIGS. 1 and 2, the plurality of first wires 140-11, 140-12, 140-21, 140-22, 140-31, 140-32, 140-41 and 140-42 may electrically connect the first to fourth light-emitting device chips CA to CD and the first to fifth upper pads 120-1 to 120-5 to each other using at least one structure among a plurality of wiring structures.

In FIGS. 1 and 2, the first to fourth light-emitting device chips 130-1 to 130-4 (CA to CD) have a vertical bonding structure, as illustrated in FIG. 6. Thus, first-first and first-second electrodes 135A and 135B of the first light-emitting device chip 130-1 (CA) are connected respectively to first-first and first-second wires 140-11 and 140-12. Similarly, first-first and first-second electrodes 135A and 135B of the second light-emitting device chip 130-2 (CB) are connected respectively to first-first and first-second wires 140-21 and 140-22. The first-first and first-second electrodes 135A and 135B of the third light-emitting device chip 130-3 (CC) are connected respectively to first-first and first-second wires 140-31 and 140-32. The first-first and first-second electrodes 135A and 135B of the fourth light-emitting device chip 130-4 (CD) are connected respectively to first-first and first-second wires 140-41 and 140-42.

According to one embodiment, as illustrated in FIG. 1, at least one structure among a plurality of wiring structures may be a serial connection structure. In this case, in order to connect the first to fourth light-emitting device chips 130-1 to 130-4 (CA to CD) in series, the plurality of first wires 140-11, 140-12, 140-21, 140-22, 140-31, 140-32, 140-41 and 140-42 may electrically connect the first to fourth light-emitting device chips 130-1 to 130-4 (CA to CD) and the first to fifth upper pads 120-1 to 120-5 (UP1 to UP5) to each other.

FIG. 7 illustrates the circuit wiring structure of the light-emitting device package 100A illustrated in FIG. 1.

As illustrated in FIG. 7, in the light-emitting device package 100A illustrated in FIG. 1, the first to fourth light-emitting device chips 130-1 to 130-4 (CA to CD) may be connected to each other in series by the first wires 140-11, 140-12, 140-21, 140-22, 140-31, 140-32, 140-41 and 140-42. The wiring structure for this is as follows.

The second electrode 136 of the first light-emitting device chip 130-1 (CA) is directly electrically connected to the first upper pad UP1, and the first electrodes 135A and 135B of the first light-emitting device chip 130-1 (CA) are electrically connected to the second upper pad UP2 by the first-first and first-second wires 140-11 and 140-12.

The second electrode 136 of the second light-emitting device chip 130-2 (CB) is directly electrically connected to the second upper pad UP2, and the first electrodes 135A and 135B of the second light-emitting device chip 130-2 (CB) are electrically connected to the third upper pad UP3 by the first-first and first-second wires 140-21 and 140-22.

The second electrode 136 of the third light-emitting device chip 130-3 (CC) is directly electrically connected to the third upper pad UP3, and the first electrodes 135A and 135B of the third light-emitting device chip 130-3 (CC) are electrically connected to the fourth upper pad UP4 by the first-first and first-second wires 140-31 and 140-32.

The second electrode 136 of the fourth light-emitting device chip 130-4 (CD) is directly electrically connected to the fourth upper pad UP4, and the first electrodes 135A and 135B of the fourth light-emitting device chip 130-4 (CD) are electrically connected to the fifth upper pad UP5 by the first-first and first-second wires 140-41 and 140-42.

In conclusion, as illustrated in FIG. 7, it can be appreciated that the first to fourth light-emitting device chips 130-1 to 130-4 (CA to CD) may be electrically connected to each other by the first wires 140-11, 140-12, 140-21, 140-22, 140-31, 140-32, 140-41 and 140-42 and the second to fourth upper pads UP2 to UP4.

According to another embodiment, as illustrated in FIG. 2, a plurality of wiring structures may include serial and parallel connection structures.

The light-emitting device package 100B illustrated in FIG. 2 may further include the second wires 142-1 and 142-2, unlike the light-emitting device package 100A illustrated in FIG. 1. The second wires 142-1 and 142-2 may electrically interconnect some of the first to fifth upper pads 120-1 to 120-5 (UP1 to UP5). For example, as illustrated in FIG. 2, the second wires 142-1 and 142-2 may electrically connect the first upper pad 120-1 (UP1) and the third upper pad 120-3 (UP3) to each other.

FIG. 8 illustrates the circuit wiring structure of the light-emitting device package 100B illustrated in FIG. 2.

As illustrated in FIG. 8, in the light-emitting device package 100B illustrated in FIG. 2, the plurality of first wires may be divided into eleventh wires 140-11, 140-12, 140-21 and 140-22 and twelfth wires 140-31, 140-32, 140-41 and 140-42.

The eleventh wires 140-11 and 140-12 connect the first light-emitting device chip 130-1 (CA) to the $(N-1)/2^{th}$ light-emitting device chip (e.g., in the case where N=5, the second light-emitting device chip 130-2 (CB)) to each other in series.

The twelfth wires 140-31 and 140-32 may connect the $((N-1)/2)+1^{th}$ light-emitting device chip (e.g., in the case where N=5, the third light-emitting device chip 130-3 (CC)) to the $N-1^{th}$ light-emitting device chip 130-4 (CD)(e.g., in the case where N=5, the fourth light-emitting device chip 130-4 (CD)) to each other in series. The wiring structure for this is as follows.

The second electrode 136 of the first light-emitting device chip 130-1 (CA) is directly electrically connected to the first upper pad UP1, and the first electrodes 135A and 135B of the first light-emitting device chip 130-1 (CA) are electrically connected to the second upper pad UP2 by the first-first and first-second wires 140-11 and 140-12.

The second electrode 136 of the second light-emitting device chip 130-2 (CB) is directly electrically connected to the second upper pad UP2, and the first electrodes 135A and 135B of the second light-emitting device chip 130-2 (CB) are electrically connected to the fifth upper pad UP5 by the first-first and first-second wires 140-21 and 140-22.

The second electrode 136 of the third light-emitting device chip 130-3 (CC) is directly electrically connected to the third upper pad UP3, and the first electrodes 135A and 135B of the third light-emitting device chip 130-3 (CC) are electrically connected to the fourth upper pad UP4 by the first-first and first-second wires 140-31 and 140-32.

The second electrode 136 of the fourth light-emitting device chip 130-4 (CD) is directly electrically connected to the fourth upper pad UP4, and the first electrodes 135A and 135B of the fourth light-emitting device chip 130-4 (CD) are electrically connected to the fifth upper pad UP5 by the first-first and first-second wires 140-41 and 140-42.

In addition, the second wires 142-1 and 142-2 may electrically connect the first upper pad 120-1 (UP1), on which the first light-emitting device chip 130-1 (CA) is disposed, among the first to $N^{th}$ upper pads 120-1 to 120-5 (UP1 to UP5), to the third upper pad 120-3 (UP3), on which the third light-emitting device chip 130-3 (CC), which is the $((N-1)/2)+1^{th}$ light-emitting device chip, is disposed. In this way, the first light-emitting device chip 130-1 (CA) and the third light-emitting device chip 130-3 (CC) may be connected in parallel to each other by the second wires 142-1 and 142-2.

That is, when the first, second, and fifth upper pads 120-1, 120-2 and 120-5, which are connected to each other in series, are referred to as a first upper pad row including a plurality of pads and the first, fourth, and fifth upper pads 120-1, 120-4 and 120-5, which are connected to each other in series, are referred to as a second upper pad row including a plurality of pads, the second wires (e.g. 142-1 and 142-2)

may electrically connect the first upper pad row and the second upper pad row to each other so as to realize a parallel connection structure.

In the case of the above-described embodiment, the number of light-emitting device chips is smaller than the number of upper pads by one, but the embodiment is not limited thereto. That is, according to another embodiment, when the number of upper pads is N, the number of light-emitting device chips may be less than N−1.

In addition, the plurality of wiring structures may include only serial connection structures, as illustrated in FIG. 7, or may complexly include serial connection structures and a parallel connection structure, as illustrated in FIG. 8. In addition, although not illustrated, the plurality of wiring structures may include only parallel connection structures. For example, when the second and fourth light-emitting device chips 130-2 and 130-4 (CB and CD), among the first to fourth light-emitting device chips 130-1 to 130-4 (CA to CD) illustrated in FIG. 2, are omitted, the first wires 140-11 and 140-12 may be connected to the fifth upper pad 120-5 (UP5) instead of the second upper pad 120-2 (UP2), and the first wires 140-31 and 140-32 may be connected to the fifth upper pad 120-5 (UP5) instead of the fourth upper pad 120-4 (UP4). In this case, the first light-emitting device chip 130-1 (CA) and the third light-emitting device chip 130-3 (CC) may form a parallel connection structure.

The case where N=5 in the light-emitting device packages 100A and 100B has been described above. Here, the above description may also be applied to the case in which N is greater than 5. In the description related to the light-emitting device packages 100A and 100B illustrated in FIGS. 1 to 8, the description related to the fifth upper pad 120-5 (UP5) corresponds to the description related to the $N^{th}$ upper pad, and the description related to the fourth light-emitting device chip 130-4 (CD) corresponds to the description related to the $N-1^{th}$ light-emitting device chip.

Hereinafter, light-emitting device packages 100C and 100D in the case where N=7 will be described with reference to FIGS. 9 to 13.

FIG. 9 illustrates a plan view of a light-emitting device package 100C according to still another embodiment, FIG. 10 illustrates a plan view of a light-emitting device package 100D according to still another embodiment, and FIG. illustrates a plan view of the body 110 and first to seventh upper pads 120-1 to 120-7 (UP1 to UP7) in the light-emitting device packages 100C and 100D illustrated in FIGS. 9 and 10.

Unlike the light-emitting device package 100A illustrated in FIG. 1, the light-emitting device package 100C illustrated in FIG. 9 further includes two sixth and seventh upper pads 120-6 and 120-7, two fifth and sixth light-emitting device chips 130-5 and 130-6, and four first wires 140-51, 140-52, 140-61 and 140-62. With this exception, the light-emitting device package 100C illustrated in FIG. 9 is the same as the light-emitting device package 100A illustrated in FIG. 1. Thus, a redundant description related to the same parts will be omitted, and only different parts will be described below.

Referring to FIG. 11, for convenience, the sixth and seventh upper pads 120-6 and 120-7 are denoted respectively by UP6 and UP7, and referring to FIGS. 9 and 10, for convenience, the fifth and sixth light-emitting device chips 130-5 and 130-6 are denoted respectively by CE and CF. The fifth and sixth light-emitting device chips 130-5 and 130-6 are respectively disposed on the fifth and sixth upper pads 120-5 and 120-6 (UP5 and UP6).

FIG. 12 illustrates a circuit connection diagram of the light-emitting device package 100C illustrated in FIG. 9.

Referring to FIGS. 9 and 12, the additional fifth and sixth light-emitting device chips 130-5 and 130-6 (CE and CF) are connected to the first to fourth light-emitting device chips 130-1 to 130-4 (CA to CD) in series by the first wires 140-51, 140-52, 140-61 and 140-62.

In addition, unlike the light-emitting device package 100B illustrated in FIG. 2, the light-emitting device package 100D illustrated in FIG. 10 further includes two sixth and seventh upper pads 120-6 and 120-7 (UP6 and UP7), two fifth and sixth light-emitting device chips 130-5 and 130-6 (CE and CF), and four first wires 140-51, 140-52, 140-61 and 140-62. With this exception, the light-emitting device package 100D illustrated in FIG. 10 is the same as the light-emitting device package 100B illustrated in FIG. 2. Thus, a redundant description related to the same parts will be omitted, and only different parts will be described below.

FIG. 13 illustrates a circuit connection diagram of the light-emitting device package 100D illustrated in FIG. 10.

As illustrated in FIG. 13, the first to third light-emitting device chips 130-1 to 130-3 (CA to CC) are connected to each other in series by the first wires 140-11, 140-12, 140-21 and 140-22. The fourth to sixth light-emitting device chips 130-4 to 130-6 (CD to CF) are connected to each other in series by the first wires 140-41, 140-42, 140-51 and 140-52.

In addition, the first light-emitting device chip 130-1 (CA) and the fourth light-emitting device chip 130-4 (CD) are connected to each other by the second wires 142-1 and 142-2 and the first upper pad 120-1 (UP1), the third light-emitting device chip 130-3 (CC) and the sixth light-emitting device chip 130-6 (CF) are connected to each other by the first wires 140-31, 140-32, 140-61 and 140-62 and the seventh upper pad 120-7 (UP7). Thus, the light-emitting device package 100D may have serial and parallel connection structures.

In the light-emitting device packages 100A to 100D illustrated in FIGS. 1, 2, 9 and 10, each of the first wires 140-11 to 146-62 and the second wires 142-1 and 142-2 may be formed of an electrically conductive material, for example, Au, and the embodiment is not limited to any specific material of the wires.

In addition, in the description related to the light-emitting device packages 100C and 100D illustrated in FIGS. 9 to 13, the description related to the seventh upper pad 120-7 (UP7) corresponds to the description related to the $N^{th}$ upper pad, and the description related to the sixth light-emitting device chip 130-6 (CF) corresponds to the description related to the $N-1^{th}$ light-emitting device chip. In consideration of this, the above description may also be applied to the case in which N is greater than 7.

In the light-emitting device packages 100A to 100D according to the embodiments, as described above, the number of light-emitting device chips is four when the number N of upper pads is 5, and the number of light-emitting device chips is sixth when the number N of upper pads is 7. That is, the number of light-emitting device chips may be smaller than the number N of upper pads by one, but the embodiment is not limited thereto.

When the planar area of the body 110 is fixed, the greater the number N of upper pads, the greater the number of light-emitting device chips, and the smaller the size of the light-emitting device chips. For example, when the number N of upper pads is five as illustrated in FIGS. 1 and 2, the length of one side of each of the square first to fourth light-emitting device chips 130-1 to 130-4 (CA to CD) may be 1400 mm. Alternatively, when the number N of upper pads is seven as illustrated in FIGS. 9 and 10, the length of one side of each of the square first to sixth light-emitting device chips 130-1 to 130-6 (CA to CF) may be reduced to 1000 mm.

In the light-emitting device packages 100A to 100D according to the above-described embodiments, it can be appreciated that the wiring structure of the light-emitting device chips may be changed in multiple ways by bonding and connecting the light-emitting device chips and the upper pads to each other in various ways using at least one of the first wires or the second wires, in the state in which the number and shape of upper pads are fixed, as illustrated in FIG. 3 or 11. That is, in the state in which the number and shape of first to fifth upper pads 120-1 to 120-5 (UP1 to UP5) are fixed, as illustrated in FIG. 3, the first to fourth light-emitting device chips 130-1 to 130-4 (CA to CD) may be connected to each other in series, as illustrated in FIG. 1, or may be connected to each other in series and in parallel, as illustrated in FIG. 2. In addition, in the state in which the number and shape of first to seventh upper pads 120-1 to 120-7 (UP1 to UP7) are fixed, as illustrated in FIG. 11, the first to sixth light-emitting device chips 130-1 to 130-6 (CA to CF) may be connected to each other in series, as illustrated in FIG. 9, or may be connected to each other in series and in parallel, as illustrated in FIG. 10.

When the wiring structure between the first wires and the upper pads is changed, as described above, the driving voltage of the light-emitting device packages 100A to 100D may be changed. For example, when the driving voltage of each of the light-emitting device chips 130-1 to 130-4 (CA to CD) illustrated in FIG. 1 is 3V, the driving voltage of the entire light-emitting device package 100A may be 12V. Alternatively, when the driving voltage of each of the light-emitting device chips 130-1 to 130-4 (CA to CD) illustrated in FIG. 2 is 3V, the driving voltage of the entire light-emitting device package 100B may be 6V. Alternatively, when the driving voltage of each of the light-emitting device chips 130-1 to 130-6 (CA to CF) illustrated in FIG. 9 is 3V, the driving voltage of the entire light-emitting device package 100C may be 18V. Alternatively, when the driving voltage of each of the light-emitting device chips 130-1 to 130-6 (CA to CF) illustrated in FIG. 10 is 3V, the driving voltage of the entire light-emitting device package 100D may be 9V.

In conclusion, it can be appreciated that the driving voltages of the light-emitting device packages 100A to 100D are changed when the bonding structure of the first and second wires is changed in the state in which the shapes and positions of the light-emitting device chips and the upper pads are fixed.

In addition, in the case of the light-emitting device packages 100A to 100D according to the embodiments, since only bonding of the first wires or the second wires is changed in order to change the wiring structure of the light-emitting device chips in the state in which the number and shape of upper pads and the number and shape of light-emitting device chips are fixed, it is possible to maximize the area occupied by the light-emitting device chip disposed on the upper pad, which may increase heat dissipation.

FIGS. 14*a* to 14*c* are views for explaining a light-emitting device package according to still another embodiment.

The light-emitting device packages 100A to 100D according to the embodiments may further include a wavelength converter 210 and a lens 220.

As illustrated in FIG. 14*a*, the wavelength converter 210 may be disposed above the upper pads of the light-emitting device packages 100 (100A to 100D) illustrated in FIGS. 1, 2, 9 and 10. Here, the wavelength converter 210 serves to convert the wavelength of light discharged from the light-emitting device chips, and may be formed of a fluorescent substance.

In addition, as illustrated in FIG. 14*b*, the lens 220 may further be disposed above the wavelength converter 210, and may have the planar shape illustrated in FIG. 14*c*. Here, the lens 220 serves to emit the light, which has the wavelength converted by the wavelength converter 210, at a desired angle. To this end, the lens 220 may have any of various shapes, except for the cross-sectional shape illustrated in FIG. 14*b*. The lens 220 may be a dome-shaped lens formed of silicon, but the embodiment is not limited as to the shape of the lens 220 or the kind of the wavelength converter 210 disposed above the upper pads.

In the case of the light-emitting device packages 100A to 100D according to the embodiments, a plurality of light-emitting device packages may be arranged on a board, and optical members, such as a light guide plate, a prism sheet, and a diffuser sheet may be disposed on the optical path of the light-emitting device packages 100A to 100D. The light-emitting device packages 100A to 100D, the board, and the optical members may function as a backlight unit.

In addition, the light-emitting device packages 100A to 100D according to the embodiments may be applied to a display apparatus, an indicator apparatus, and a lighting apparatus.

Here, the display apparatus may include a bottom cover, a reflector disposed on the bottom cover, a light-emitting module for emitting light, a light guide plate disposed in front of the reflector to guide light emitted from the light-emitting module forwards, an optical sheet including prism sheets disposed in front of the light guide plate, a display panel disposed in front of the optical sheet, an image signal output circuit connected to the display panel to supply an image signal to the display panel, and a color filter disposed in front of the display panel. Here, the bottom cover, the reflector, the light-emitting module, the light guide plate, and the optical sheet may form a backlight unit.

In addition, the lighting apparatus may include a light source module including a board and any one of the light-emitting device packages 100A to 100D according to the embodiments, a radiator configured to dissipate heat of the light source module, and a power supply unit configured to process or convert an electrical signal received from the outside and provide the same to the light source module. For example, the lighting apparatus may include a lamp, a headlamp, or a street light.

The headlamp may include a light-emitting module including a plurality of light-emitting device packages disposed on a board, a reflector configured to reflect light emitted from the light-emitting module in a given direction, for example, in the forward direction, a lens configured to refract the light reflected by the reflector forwards, and a shade configured to block or reflect some of the light, which has been reflected by the reflector to thereby be directed to the lens, so as to realize the light distribution pattern desired by a designer.

The above description merely describes the technical sprit of the embodiments by way of example, and various modifications and substitutions related to the above description are possible by those skilled in the art without departing from the scope and spirit of the disclosure. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

MODE FOR INVENTION

Modes for the implementation of embodiments have sufficiently been described in the "best mode" described above.

INDUSTRIAL APPLICABILITY

A light-emitting device package according to the embodiments may be used in a display apparatus, an indicator apparatus, and a lighting apparatus.

The invention claimed is:
1. A light-emitting device package comprising;
a body;
N (N denoting a positive integer of 5 or more) upper pads disposed on the body so as to be spaced apart from each other;
N−1 light-emitting device chips respectively disposed on N−1 upper pads, among the N upper pads; and
a plurality of first wires configured to electrically connect the N−1 light-emitting device chips and the N upper pads to each other,
wherein a first upper pad and an $N^{th}$ upper pad, among the N upper pads, face each other at an outermost peripheral region of a plane of the light-emitting device package,
wherein the remaining second to $N-1^{th}$ upper pads, excluding the first and $N^{th}$ upper pads, among the N upper pads are completely surrounded by the first and $N^{th}$ upper pads in a plan view so that one of the first and $N^{th}$ upper pads is between each of the remaining second to $N-1^{th}$ upper pads and an edge of the body, and
wherein a light-emitting device chip of the N−1 light-emitting device chips is disposed on one among the first and $N^{th}$ upper pads and is not disposed on the other among the first and $N^{th}$ upper pads.
2. The package according to claim 1, wherein the plurality of first wires form serial connection structures.
3. The package according to claim 1, wherein the plurality of first wires form serial and parallel connection structures.
4. The package according to claim 3, further comprising a second wire configured to electrically connect some of the N upper pads to each other.
5. The package according to claim 4, wherein the plurality of first wires comprises:
an eleventh wire configured to connect first to $(N-1)/2^{th}$ light-emitting device chips, among the N−1 light-emitting device chips, to each other in series; and
a twelfth wire configured to connect $((N-1)/2)+1^{th}$ to $N-1^{th}$ light-emitting device chips, among the N−1 light-emitting device chips, to each other in series, and
wherein the second wire electrically connects the upper pad, on which the first light-emitting device chip is disposed, and the upper pad, on which the $((N-1)/2)+1^{th}$ light-emitting device chip is disposed, to each other, among the N upper pads.
6. The package according to claim 1, wherein each of the first and $N^{th}$ upper pads has a planar area greater than a planar area of each of the second to $N-1^{th}$ upper pads.
7. The package according to claim 1, further comprising:

a first lower pad disposed on an underside of the body and electrically connected to one of the first and $N^{th}$ upper pads among the N upper pads; and
a second lower pad spaced apart from the first lower pad on the underside of the body and electrically connected to a remaining one of the first and $N^{th}$ upper pads.
8. The package according to claim 7, further comprising:
a first connection pad penetrating the body to interconnect one of the first and $N^{th}$ upper pads and the first lower pad; and
a second connection pad penetrating the body to interconnect a remaining one of the first and $N^{th}$ upper pads and the second lower pad.
9. The package according to claim 8, further comprising a heat dissipation pad disposed on the underside of the body between the first and second lower pads and spaced apart from each of the first and second lower pads.
10. The package according to claim 9, wherein the heat dissipation pad is located at a center on an underside of the body.
11. The package according to claim 9, wherein an area of a lower surface of the body that is occupied by the heat dissipation pad is greater than an area of a lower surface of the body that is occupied by each of the first and second lower pads.
12. The package according to claim 1, wherein the one of the first and $N^{th}$ upper pads not having the light-emitting device chip is connected by wires to only one of the remaining upper pads.
13. A light-emitting device package, comprising:
a body;
a plurality of upper pads disposed on the body so as to be spaced apart from each other;
a plurality of light-emitting device chips respectively disposed on some upper pads among the plurality of upper pads; and
a plurality of first wires configured to electrically connect the light-emitting device chips and the upper pads to each other,
wherein the number of upper pads is greater than the number of light-emitting device chips,
wherein two upper pads among the upper pads face each other at an outermost peripheral region of a plane of the light-emitting device package,
wherein the remaining upper pads excluding the two upper pads among the upper pads are surrounded by the two upper pads in a plan view,
wherein a light-emitting device chip of the plurality of light-emitting device chips is disposed on one among the two upper pads and is not disposed on the other among the two upper pads, and
wherein the two upper pads among the upper pads completely surround the remaining pads so that one of the two upper pads among the upper pads is between each of the remaining second to $N-1^{th}$ upper pads and an edge of the body.
14. The package according to claim 13, wherein the plurality of first wires form a serial connection structure.
15. The package according to claim 13, wherein the plurality of first wires form a parallel connection structure.
16. The package according to claim 13, wherein the plurality of first wires form serial and parallel connection structures.
17. The package according to claim 16, wherein the serial connection structure includes a first upper pad row including a plurality of pads connected to each other in series and a second upper pad row including a plurality of pads connected to each other in series, and wherein the light-emitting device package further comprises a second wire configured to electrically connect the first upper pad row and the second upper pad row to each other so as to realize the parallel connection structure.

18. The package according to claim 13, wherein the number of upper pads is greater than the number of light-emitting device chips by one.

19. The package according to claim 13, wherein the plurality of upper pads is asymmetrically disposed in a plane.

20. The package according to claim 13, wherein the one among the two upper pads not having the light-emitting device chip is connected by wires to only one of the remaining upper pads.

* * * * *